(12) United States Patent
Grella et al.

(10) Patent No.: US 11,830,699 B2
(45) Date of Patent: Nov. 28, 2023

(54) COLD-FIELD-EMITTER ELECTRON GUN WITH SELF-CLEANING EXTRACTOR USING REVERSED E-BEAM CURRENT

(71) Applicant: KLA Corporation, Milpitas, CA (US)

(72) Inventors: Luca Grella, Gilroy, CA (US); Nikolai Chubun, San Jose, CA (US); Stephen Pitts, Sunnyvale, CA (US)

(73) Assignee: KLA Corporation, Milpitas, CA (US)

( * ) Notice: Subject to any disclaimer, the term of this patent is extended or adjusted under 35 U.S.C. 154(b) by 356 days.

(21) Appl. No.: 17/368,707

(22) Filed: Jul. 6, 2021

(65) Prior Publication Data

US 2023/0010176 A1    Jan. 12, 2023

(51) Int. Cl.
*H01J 37/073* (2006.01)
*H01J 37/32* (2006.01)
*H01J 37/063* (2006.01)

(52) U.S. Cl.
CPC .......... *H01J 37/073* (2013.01); *H01J 37/063* (2013.01); *H01J 37/32862* (2013.01); *H01J 2237/022* (2013.01)

(58) Field of Classification Search
None
See application file for complete search history.

(56) References Cited

U.S. PATENT DOCUMENTS

| 7,355,186 B2 | 4/2008 | Jasinski |
| 8,519,355 B2 | 8/2013 | Buhler et al. |
| 8,736,170 B1 | 5/2014 | Liu et al. |
| 9,847,208 B1 * | 12/2017 | Adamec .................. H01J 1/304 |
| 10,861,666 B1 | 12/2020 | Winkler |

(Continued)

FOREIGN PATENT DOCUMENTS

| EP | 2815418 B1 | 6/2018 |
| EP | 3518268 A1 | 7/2019 |
| WO | 2021061500 A1 | 4/2021 |

OTHER PUBLICATIONS

PCT/US2022/036069, International Search Report, dated Oct. 28, 2022.

(Continued)

*Primary Examiner* — Roberts P Culbert
(74) *Attorney, Agent, or Firm* — Huse IP Law; Charles C. Huse

(57) ABSTRACT

An e-beam device includes a cold-field emission source to emit electrons and an extractor electrode to be positively biased with respect to the cold-field emission source to extract the electrons from the cold-field emission source. The extractor electrode has a first opening for the electrons. The e-beam device also includes a mirror electrode with a second opening for the electrons. The mirror electrode is configurable to be positively biased with respect to the extractor electrode during a first mode of operation and to be negatively biased with respect to the extractor electrode during a second mode of operation. The extractor electrode is disposed between the cold-field emission source and the mirror electrode. The e-beam device further includes an anode to be positively biased with respect to the extractor electrode and the cold-field emission source. The mirror electrode is disposed between the extractor electrode and the anode.

19 Claims, 4 Drawing Sheets

(56) References Cited

U.S. PATENT DOCUMENTS

| | | | |
|---|---|---|---|
| 2007/0158588 A1* | 7/2007 | Zhou ............... | H01J 37/073 250/492.2 |
| 2014/0166870 A1 | 6/2014 | Reijonen et al. | |
| 2014/0264019 A1 | 9/2014 | Adamec | |
| 2015/0008323 A1 | 1/2015 | Arbouet et al. | |
| 2017/0032926 A1 | 2/2017 | Miyamoto | |
| 2019/0096626 A1 | 3/2019 | Kohno | |

OTHER PUBLICATIONS

PCT/US2022/036069, Written Opinion of the International Searching Authority, dated Oct. 28, 2022.

F. Houdellier et al., "Development of TEM and SEM high brightness electron guns using cold-field emission from a carbon nanotip," Ultramicroscopy vol. 151, pp. 107-115, Apr. 2015.

Hitachi, "Hitachi's Coherent Cold-Field-Emission Source," 2016, available at https://www.hitachi-hightech.com/global/science/technical/tech/microscopes/cold_fe/.

R.A. Baragiola et al., "Desorption Induced by Electronic Transitions: Basic Principles and Mechanisms," Interaction of Charged Particles with Solids and Surfaces (A. Gras-Marti et al., eds.), Plenum Press, New York, 1991, pp. 313-314.

* cited by examiner

300

```
┌─────────────────────────────────────────────────────────────────────────────┐
│ Provide an electron-beam device that includes a cold-field emission source, │
│ an extractor electrode with a first opening for electrons from the cold-    │
│ field emission source, a mirror electrode with a second opening for the     │
│ electrons, and an anode. The extractor electrode is disposed between the    │
│ cold-field emission source and the mirror electrode. The mirror electrode   │
│ is disposed between the extractor electrode and the anode. (302)            │
└─────────────────────────────────────────────────────────────────────────────┘
                                      ↓
┌─────────────────────────────────────────────────────────────────────────────┐
│     Bake out the extractor electrode. Flash the cold-field emission         │
│                            source. (304)                                    │
└─────────────────────────────────────────────────────────────────────────────┘
                                      ↓
┌─────────────────────────────────────────────────────────────────────────────┐
│  Clean the extractor electrode: positively bias the extractor electrode     │
│  with respect to the cold-field emission source and the mirror electrode.   │
│                                 (306)                                       │
│  ┌───────────────────────────────────────────────────────────────────────┐  │
│  │ Electrically connect the mirror electrode to the cold-field emission  │  │
│  │                           source. (308)                               │  │
│  │  ┌─────────────────────────────────────────────────────────────────┐  │  │
│  │  │ Configure a switch to electrically connect the mirror electrode │  │  │
│  │  │          to the cold-field emission source. (310)               │  │  │
│  │  └─────────────────────────────────────────────────────────────────┘  │  │
│  └───────────────────────────────────────────────────────────────────────┘  │
│  ┌───────────────────────────────────────────────────────────────────────┐  │
│  │ Apply a first negative voltage to the cold-field emission source and  │  │
│  │ the mirror electrode. Apply a second negative voltage to the          │  │
│  │ extractor electrode. The magnitude of the second negative voltage is  │  │
│  │ less than the magnitude of the first negative voltage. (312)          │  │
│  └───────────────────────────────────────────────────────────────────────┘  │
└─────────────────────────────────────────────────────────────────────────────┘
                                      ↓
┌─────────────────────────────────────────────────────────────────────────────┐
│  Use the electron-beam device: positively bias the extractor electrode      │
│  with respect to the cold-field emission source; positively bias the        │
│  mirror electrode and the anode with respect to the extractor electrode.    │
│  (314)                                                                      │
│  ┌───────────────────────────────────────────────────────────────────────┐  │
│  │     Electrically connect the mirror electrode to the anode. (316)     │  │
│  │  ┌─────────────────────────────────────────────────────────────────┐  │  │
│  │  │ Configure the switch to electrically connect the mirror         │  │  │
│  │  │                 electrode to the anode. (318)                   │  │  │
│  │  └─────────────────────────────────────────────────────────────────┘  │  │
│  └───────────────────────────────────────────────────────────────────────┘  │
│  ┌───────────────────────────────────────────────────────────────────────┐  │
│  │        Ground the mirror electrode and the anode. (320)               │  │
│  └───────────────────────────────────────────────────────────────────────┘  │
│  ┌───────────────────────────────────────────────────────────────────────┐  │
│  │ Apply the first negative voltage to the cold-field emission source.   │  │
│  │ Apply the second negative voltage to the extractor electrode. (322)   │  │
│  └───────────────────────────────────────────────────────────────────────┘  │
└─────────────────────────────────────────────────────────────────────────────┘
```

Figure 3

COLD-FIELD-EMITTER ELECTRON GUN WITH SELF-CLEANING EXTRACTOR USING REVERSED E-BEAM CURRENT

TECHNICAL FIELD

This disclosure relates to electron-beam ("e-beam") devices, and more specifically to cleaning the extractor electrode of the electron gun in an e-beam device.

BACKGROUND

A cold-field emission source could be a suitable choice for high-throughput and high-spatial-resolution e-beam applications. The use of a cold-field emission source in such applications is challenged, however, by residual gas pressure, which can contaminate the cold-field emission source, shorten its lifetime, and introduce emission noise. The residual gas pressure of a typical extreme ultra-high vacuum environment (≈1e-11 torr) is created by the outgassing of vacuum-chamber components. One such component is the extractor electrode (sometimes simply referred to as the extractor). Once the cold-field emission source has been installed and nominal vacuum achieved, the extractor electrode is baked out to reduce subsequent outgassing. But bakeout alone is not sufficient to completely desorb molecules from surfaces of the extractor electrode near the cold-field emission source.

SUMMARY

Accordingly, there is a need for methods and systems for cleaning the extractor electrode.

In some embodiments, an e-beam device includes a cold-field emission source to emit electrons and an extractor electrode to be positively biased with respect to the cold-field emission source to extract the electrons from the cold-field emission source. The extractor electrode has a first opening for the electrons. The e-beam device also includes a mirror electrode with a second opening for the electrons. The mirror electrode is configurable to be positively biased with respect to the extractor electrode during a first mode of operation and to be negatively biased with respect to the extractor electrode during a second mode of operation. The extractor electrode is disposed between the cold-field emission source and the mirror electrode. The e-beam device further includes an anode to be positively biased with respect to the extractor electrode and the cold-field emission source. The mirror electrode is disposed between the extractor electrode and the anode.

In some embodiments, a method includes providing an e-beam device that includes a cold-field emission source, an extractor electrode with a first opening for electrons from the cold-field emission source, a mirror electrode with a second opening for the electrons, and an anode. The extractor electrode is disposed between the cold-field emission source and the mirror electrode. The mirror electrode is disposed between the extractor electrode and the anode. The method also includes cleaning the extractor electrode, which includes positively biasing the extractor electrode with respect to the cold-field emission source and the mirror electrode. The method further includes, after cleaning the extractor electrode, using the e-beam device. Using the e-beam device includes positively biasing the extractor electrode with respect to the cold-field emission source and positively biasing the mirror electrode and the anode with respect to the extractor electrode.

BRIEF DESCRIPTION OF THE DRAWINGS

For a better understanding of the various described implementations, reference should be made to the Detailed Description below, in conjunction with the following drawings.

FIG. 3 is a flowchart illustrating a method of operating an e-beam device in accordance with some embodiments.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Cold-field emission, which is sometimes simply called field emission, refers to the emission of electrons from a pointed emitter in the presence of a negative potential (e.g., of several kilovolts) relative to a nearby electrode. Cold-field emission may occur at room temperature (which is considered cold compared to thermionic emission) and may result in an e-beam with an electron density several orders of magnitude higher than an e-beam produced through thermionic emission.

Figure 1A:
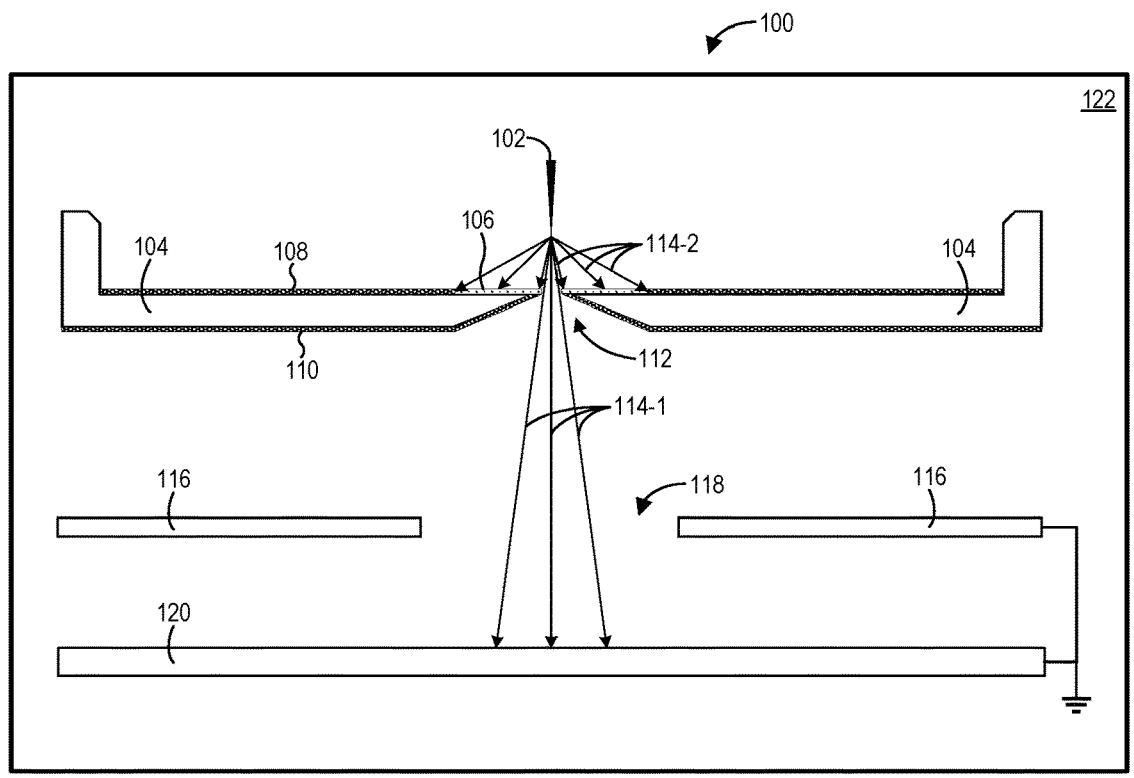
FIG. 1A is a cross-sectional side view of an e-beam device that includes a cold-field emission source, an extractor electrode, a mirror electrode, and an anode, with the e-beam device being configured for a normal operating mode, in accordance with some embodiments.
Figure 1B:
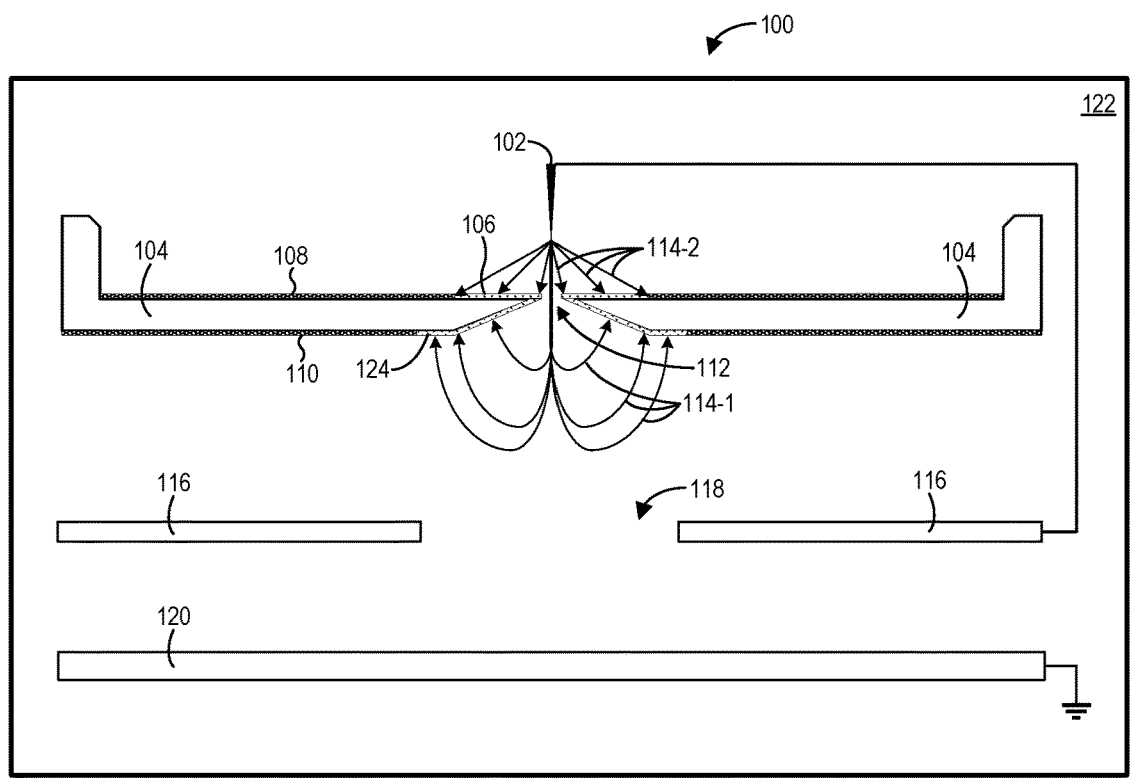
FIG. 1B is a cross-sectional side view of the e-beam device of FIG. 1A as configured for a mode of operation for cleaning the extractor electrode, in accordance with some embodiments.

FIGS. 1A and 1B are cross-sectional side views of an e-beam device 100 that includes a cold-field emission source 102, an extractor electrode 104, a mirror electrode 116, and an anode 120, arranged in that order, in accordance with some embodiments. The cold-field emission source 102 may also be referred to as a field emission source, field emitter, or cold-field emitter. The extractor electrode 104 is disposed between the cold-field emission source 102 and the mirror electrode 116, and the mirror electrode 116 is disposed between the extractor electrode 104 and the anode 120. The cold-field emission source 102 has a sharpened tip pointed toward the anode 120. In this arrangement, the cold-field emission source 102 acts as a cathode. These components are disposed in a vacuum chamber 122. The vacuum chamber 122 may provide an ultra-high vacuum (UHV). (UHV is a standard, well-known technical term that refers to vacuums with a pressure on the order of $10^{-9}$ torr or lower.) In some embodiments, the e-beam device 100 is an electron microscope (e.g., a scanning electron microscope (SEM)).

FIG. 1A shows the e-beam device 100 configured for a first mode of operation in accordance with some embodiments. The first mode of operation is a normal operating mode. A first voltage $-V_{beam}$ is applied to the cold-field emission source 102. A second voltage $+V_{ext}$-$V_{beam}$ is applied to the extractor electrode 104 to positively bias the extractor electrode 104 with respect to the cold-field emission source 102. In one example, $V_{beam}$ is 10 kV and $V_{ext}$ is 3 kV, such that $-10$ kV is applied to the cold-field emission source 102 and $-7$ kV is applied to the extractor electrode 104. Other examples are possible. For example, the voltage difference between the extractor electrode 104 and the cold-field emission source 102 (i.e., $V_{ext}$) may be 3 kV-5 kV. The anode 120 and mirror electrode 116 are positively biased with respect to the cold-field emission source 102 and the extractor electrode 104. For example, the anode 120 and mirror electrode 116 are grounded, with the mirror electrode 116 being electrically connected to the anode 120.

With the components biased in this manner, the cold-field emission source 102 emits electrons 114: the extractor electrode 104 extracts electrons 114 from the cold-field emission source 102. The cold-field emission source 102 and the extractor electrode 104 thus act as an electron gun for the e-beam device 100. Some electrons 114-1 pass through an opening 112 in the extractor electrode 104 (e.g., in the center of the extractor electrode 104). The electrons 114-1 also pass through an opening 118 in the mirror electrode 116 (e.g., in the center of the mirror electrode 116). The opening 112 in the extractor electrode 104 is situated beneath the cold-field emission source 102. The opening 118 in the mirror electrode 116 is situated beneath the opening 112 in the extractor electrode 104. In some embodiments, the opening 118 is wider than the opening 112 (e.g., such that substantially all electrons 114-1 that pass through the opening 112 also pass through the opening 118). In some embodiments, the extractor electrode 104 and/or the mirror electrode 116 are radially symmetric about an axis that extends through the cold-field emission source 102, the opening 112 (e.g., the center of the opening 112), and/or the opening 118 (e.g., the center of the opening 118).

Other electrons 114-2 emitted by the cold-field emission source 102 miss the opening 112 and impact a portion 106 of the top surface of the extractor electrode 104 that surrounds the opening 112. The top surface of the extractor electrode 104 is the surface that faces the cold-field emission source 102. The current from the electrons 114-2 impacting the portion 106 of the top surface cleans chemisorbed radicals (i.e., desorbs the radicals) from the portion 106 by means of e-beam Desorption Induced by Electronic Transitions (DIET). Other surfaces of the extractor electrode 104, including the bottom surface 110 (i.e., the surface facing the mirror electrode 116) and the portion 108 of the top surface beyond (e.g., surrounding) the portion 106, are impacted by a much smaller electron current than the portion 106. The portion 108 and the bottom surface 110 therefore tend to have a chemisorbed monolayer that will release positive ions upon occasional electron impact through induced desorption. The released positive ions will follow the reversed electron trajectory and reach the cold-field emission source 102, reducing emission lifetime and creating emission noise.

To clean and anneal a portion of the bottom surface 110 near the opening 112, including the inner bore of the extractor electrode 104, as well as to clean and anneal the portion 106 of the top surface, the electric field in the region between the extractor electrode 104 and the mirror electrode 116 is reversed with respect to the normal operating mode. Reversing the electric field in this region causes the e-beam (i.e., the electrons 114-1) to turn around and impact a portion 124 (FIG. 1B) of the bottom surface 110 (including the portion defining the inner bore of the extractor electrode 104), thereby desorbing radicals from the monolayer on the portion of the bottom surface 110. (The bottom surface 110 faces the mirror electrode 116). This process may be performed after baking out the extractor electrode 104 and/or flashing the cold-field emission source 102. The ions emitted by this desorption will follow the reversed field and be directed away from the cold-field emission source 102.

FIG. 1B shows the e-beam device 100 configured for a second mode of operation (i.e., a mode for cleaning the extractor electrode 104) in accordance with some embodiments. As in the first mode of FIG. 1A, the extractor electrode 104 is positively biased with respect to the cold-field emission source 102. For example, the first voltage $-V_{beam}$ is applied to the cold-field emission source 102 and the second voltage $+V_{ext}$-$V_{beam}$ is applied to the extractor electrode 104, to extract electrons 114 from the cold-field emission source 102 (i.e., to cause the cold-field emission source 102 to emit electrons). Also as in the first mode, the anode 120 may be positively biased with respect to the extractor electrode 104 and the cold-field emission source 102. For example, the anode 120 is grounded. The mirror electrode 116, however, is configured to be negatively biased with respect to the extractor electrode 104. In some embodiments, the mirror electrode 116 is electrically connected to the cold-field emission source 102, as shown in FIG. 1B. For example, the first voltage $-V_{beam}$ is applied to both the cold-field emission source 102 and the mirror electrode 116, while the second voltage $+V_{ext}$-$V_{beam}$ is applied to the extractor electrode 104.

The mirror electrode 116 is thus configurable to be positively biased with respect to the extractor electrode 104 during the first mode of operation and to be negatively biased with respect to the extractor electrode 104 during the second mode of operation. In some embodiments, the mirror electrode 116 is configurable to be electrically connected to the anode 120 during the first mode of operation (as shown in FIG. 1A) and to be electrically connected to the cold-field emission source 102 during the second mode of operation (as shown in FIG. 1B).

Negatively biasing the mirror electrode 116 sufficiently (e.g., by at least $V_{ext}$) with respect to the extractor electrode 104 directs the electrons 114-1 that pass through the opening 112 back toward the extractor electrode 104, where they impact a portion 124 of the bottom surface, thus cleaning and annealing the portion 124. The mirror electrode 116 effectively acts as a mirror that reflects the electrons 114-1 back to the extractor electrode 104, resulting in self-cleaning of the extractor electrode 104.

Figure 2:
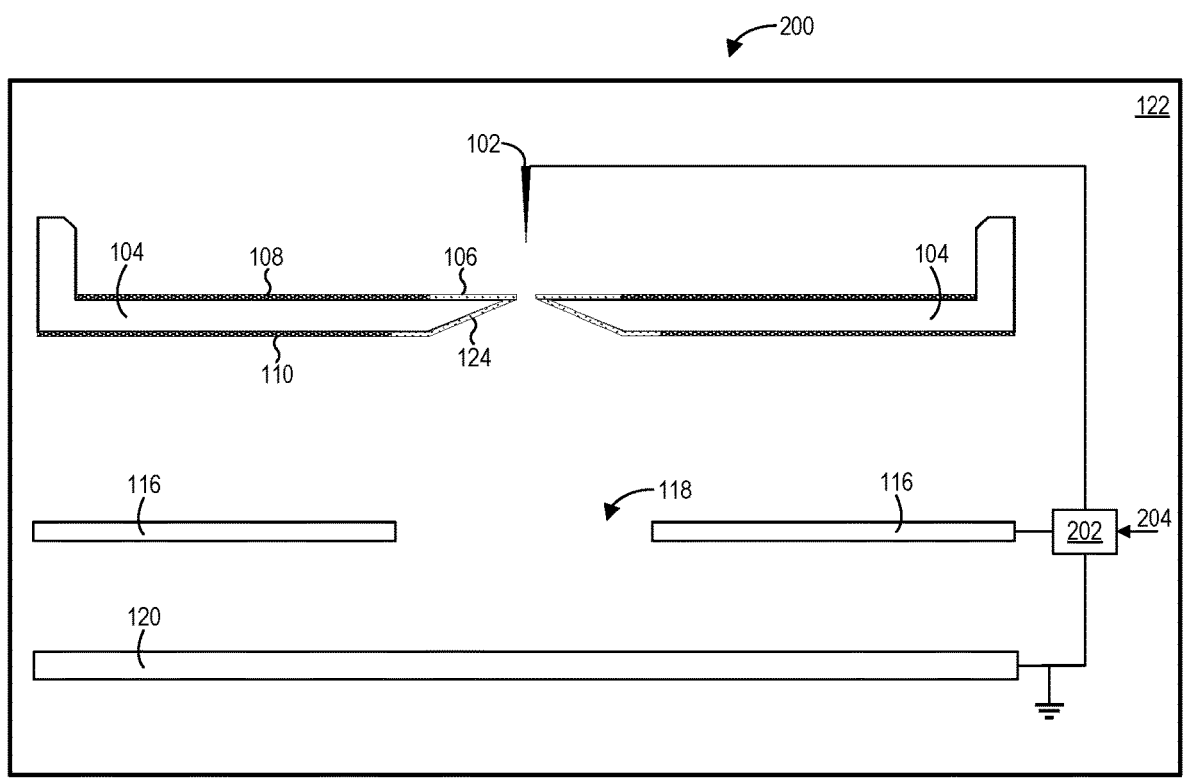
FIG. 2 shows an example of the e-beam device of FIGS. 1A-1B in which a switch is used to configure the mirror electrode, in accordance with some embodiments.

FIG. 2 is a cross-sectional side view of an e-beam device 200 that is an example of the e-beam device 100 (FIGS. 1A-1B) in accordance with some embodiments. The e-beam device 200 includes a switch 202 that is used to configure (i.e., bias) the mirror electrode 116. The switch 202 is used to electrically connect the mirror electrode 116 to the anode 120 during the first mode of operation (i.e., during the normal operating mode) and to the cold-field emission source 102 during the second mode of operation (i.e., during the extractor-electrode cleaning mode). The mirror electrode 116, cold-field emission source 102, and anode 120 are electrically connected to respective terminals of the switch 202. The switch 202 is controlled by a control signal 204. In the first mode of operation, the control signal 204 causes the switch 202 to connect the terminal for the mirror electrode 116 to the terminal for the anode 120. In the second mode of operation, the control signal 204 causes the switch 202 to connect the terminal for the mirror electrode 116 to the terminal for the cold-field emission source 102. In some embodiments, the control signal 204 may be asserted for the first mode of operation and de-asserted for the second mode of operation, or vice-versa.

FIG. 3 is a flowchart illustrating a method 300 of operating an e-beam device in accordance with some embodiments. In the method 300, an e-beam device (e.g., device 100, FIGS. 1A-1B; device 200, FIG. 2) is provided (302) that includes a cold-field emission source (e.g., cold-field emission source 102), an extractor electrode (e.g., extractor electrode 104) with a first opening (e.g., opening 112) for electrons from the cold-field emission source, a mirror electrode (e.g., mirror electrode 116) with a second opening (e.g., opening 118) for the electrons, and an anode (e.g., anode 120). The extractor electrode is disposed between the cold-field emission source and the mirror electrode. The mirror electrode is disposed between the extractor electrode and the anode. In some embodiments, the first opening is situated beneath the cold-field emission source and the second opening is situated beneath the first opening. The second opening may be wider than the first opening. The extractor electrode and the mirror electrode may be radially symmetric about an axis through the cold-field emission source, the first opening (e.g., the center of the first opening), and/or the second opening (e.g., the center of the second opening).

To reduce contamination and achieve a high vacuum, the extractor electrode is baked out (304) and the cold-field emission source is flashed (304). Bakeout may be performed at approximately 200° C., by direct heating of the extractor electrode through a resistor. Flashing refers to briefly (e.g., for a period of several seconds) heating the cold-field emission source to clean its surface. Bakeout and flashing are performed before turning on the e-beam.

To further reduce contamination, the extractor electrode is cleaned (306). This cleaning may be performed after bakeout and flashing. Cleaning the extractor electrode includes positively biasing the extractor electrode with respect to the cold-field emission source and the mirror electrode. Positively biasing the extractor electrode with respect to the cold-field emission source extracts electrons from the cold-field emission source, thereby turning on the e-beam. Positively biasing the extractor electrode with respect to the mirror electrode causes the mirror electrode to act as a mirror that reflects electrons back to the bottom surface of the extractor electrode.

In some embodiments, to clean the extractor electrode, the mirror electrode is electrically connected (308) to the cold-field emission source (e.g., as shown in FIG. 1B). For example, a switch (e.g., switch 202, FIG. 2) is configured (310) to electrically connect the mirror electrode to the cold-field emission source. In some embodiments, a first negative voltage (e.g., $-V_{beam}$) is applied (312) to the cold-field emission source and the mirror electrode (e.g., is applied to the cold-field emission source while the mirror electrode is electrically connected to the cold-field emission source), and a second negative voltage (e.g., $+V_{ext}-V_{beam}$) is applied (312) to the extractor electrode. The magnitude of the second negative voltage is less than the magnitude of the first negative voltage (e.g., by the amount $V_{ext}$). For example, the first negative voltage is –10 kV and the second negative voltage is –7 kV. In other examples, the difference between the second negative voltage and the first negative voltage is 3 kV-5 kV.

After the extractor electrode has been cleaned, the e-beam device is used (314). To use the e-beam device, the extractor electrode is positively biased with respect to the cold-field emission source, and the mirror electrode and the anode are positively biased with respect to the extractor electrode. In some embodiments, the mirror electrode is electrically connected (316) to the anode (e.g., as shown in FIG. 1A). For example, the switch (e.g., switch 202, FIG. 2) is configured (318) to electrically connect the mirror electrode to the anode. The mirror electrode and the anode may be grounded (320) (e.g., the anode may be grounded and the mirror electrode connected to the anode, thereby also grounding the mirror electrode). The first negative voltage (e.g., $-V_{beam}$) may be applied (322) to the cold-field emission source and the second negative voltage (e.g., $+V_{ext}-V_{beam}$) may be applied (322) to the extractor electrode.

The method 300 improves the cleaning of the surfaces of the extractor electrode by exploiting Desorption Induced by Electronic Transition in the cleaning step 306. Performance of the cold-field emission source during use of the e-beam device (i.e., during the step 314) is thus improved, as is the lifetime of the cold-field emission source.

Figure 4:
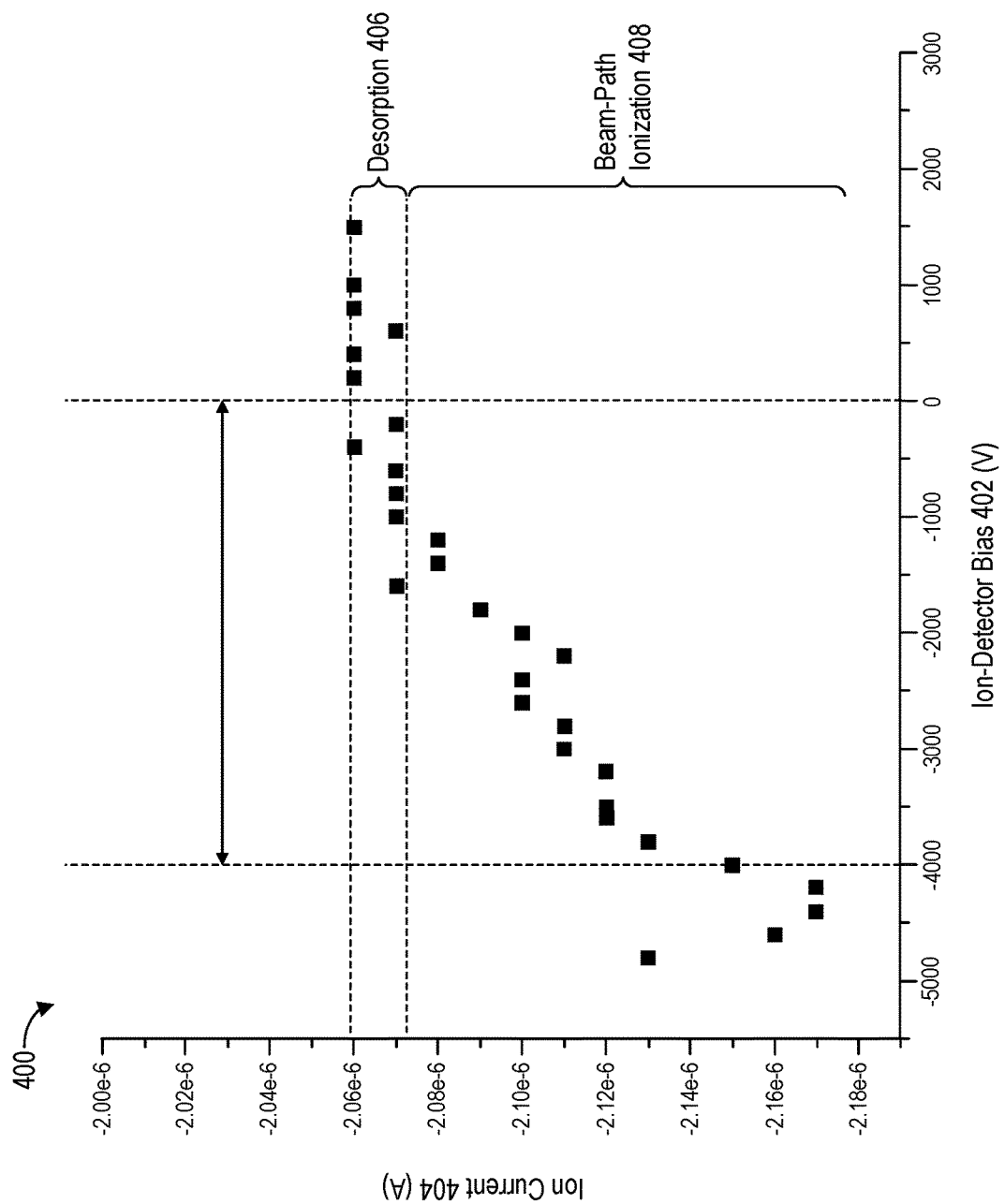
FIG. 4 is a graph demonstrating the reduction in steady-state outgassing achieved through e-beam irradiation of a surface.

FIG. 4 is a graph 400 demonstrating the reduction in steady-state outgassing achieved through e-beam irradiation of a surface. To generate the graph 400, the anode 120 in the arrangement of FIG. 1B was replaced with a micro-channel plate that acts as an ion detector. The bias 402 of the ion detector is varied and the ion current 404 measured by the ion detector is recorded for different values of the bias 402. The bias 402 is relative to the potential of the extractor electrode 104. The pressure of the vacuum was 1e-8 torr (i.e., $10^{-8}$ torr). Down to a bias 402 of –1000V, the current 404 is in a regime 406 that corresponds to high-energy ions generated at the extractor electrode by desorption (i.e., by DIET). In the regime 406, the current 404 is substantially constant and independent of the bias 402. As the bias 402 drops below –1000V and becomes increasingly more negative, the current 404 enters a regime 408 in which it becomes more negative: the absolute value of the current increases. The regime 408 corresponds to lower-energy ions created by electron ionization along the beam path (i.e., free-space ionization); the extra current in the regime 408 as compared to the regime 406 is due to ions generated by free-space ionization. The increase in the magnitude of the current 404 as the bias 402 becomes more negative indicates that ions created by free-space ionization outnumber ions created by desorption from the extractor electrode 104: the surface of the extractor electrode 104 generates fewer ions than free-space electron ionization. These results show that continuous electron irradiation of the extractor electrode 104 removes chemisorbed contaminants from the extractor electrode 104 and minimizes steady-state desorption for the extractor electrode 104 by preventing a monolayer of chemisorbed contaminants from forming.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electron-beam device, comprising:
a cold-field emission source to emit electrons;
an extractor electrode to be positively biased with respect to the cold-field emission source to extract the electrons from the cold-field emission source, the extractor electrode having a first opening for the electrons;
a mirror electrode having a second opening for the electrons and being configurable to be positively biased with respect to the extractor electrode during a first mode of operation and to be negatively biased with respect to the extractor electrode during a second mode of operation, wherein the extractor electrode is disposed between the cold-field emission source and the mirror electrode; and
an anode to be positively biased with respect to the extractor electrode and the cold-field emission source, wherein the mirror electrode is disposed between the extractor electrode and the anode.

2. The device of claim 1, wherein the mirror electrode is configurable to be electrically connected to the anode during the first mode of operation and to be electrically connected to the cold-field emission source during the second mode of operation.

3. The device of claim 2, further comprising a switch to electrically connect the mirror electrode to the anode during the first mode of operation and to the cold-field emission source during the second mode of operation.

4. The device of claim 2, wherein the anode is grounded.

5. The device of claim 1, wherein:
the first opening is situated beneath the cold-field emission source; and
the second opening is situated beneath the first opening.

6. The device of claim 5, wherein the second opening is wider than the first opening.

7. The device of claim 5, wherein the extractor electrode and the mirror electrode are radially symmetric about an axis through the cold-field emission source, the first opening, and the second opening.

8. The device of claim 1, wherein:
the first mode of operation is a normal operating mode; and
the second mode of operation is a mode for cleaning the extractor electrode.

9. A method, comprising:
providing an electron-beam device comprising a cold-field emission source, an extractor electrode with a first opening for electrons from the cold-field emission source, a mirror electrode with a second opening for the electrons, and an anode, wherein:
the extractor electrode is disposed between the cold-field emission source and the mirror electrode, and
the mirror electrode is disposed between the extractor electrode and the anode;
cleaning the extractor electrode, comprising positively biasing the extractor electrode with respect to the cold-field emission source and the mirror electrode; and
after cleaning the extractor electrode, using the electron-beam device, comprising:
positively biasing the extractor electrode with respect to the cold-field emission source, and
positively biasing the mirror electrode and the anode with respect to the extractor electrode.

10. The method of claim 9, wherein positively biasing the extractor electrode with respect to the cold-field emission source and the mirror electrode comprises electrically connecting the mirror electrode to the cold-field emission source.

11. The method of claim 9, wherein positively biasing the mirror electrode and the anode with respect to the extractor electrode comprises electrically connecting the mirror electrode to the anode.

12. The method of claim 11, wherein positively biasing the mirror electrode and the anode with respect to the extractor electrode further comprises grounding the mirror electrode and the anode.

13. The method of claim 9, wherein:
positively biasing the extractor electrode with respect to the cold-field emission source comprises applying a first negative voltage to the cold-field emission source and applying a second negative voltage to the extractor electrode, wherein the magnitude of the second negative voltage is less than the magnitude of the first negative voltage;
positively biasing the extractor electrode with respect to the cold-field emission source and the mirror electrode comprises applying the first negative voltage to the cold-field emission source and the mirror electrode and applying the second negative voltage to the extractor electrode; and
positively biasing the mirror electrode and the anode with respect to the extractor electrode comprises grounding the mirror electrode and the anode.

14. The method of claim 9, wherein:
the electron-beam device further comprises a switch to selectively connect the mirror electrode electrically to the cold-field emission source or the anode;
positively biasing the extractor electrode with respect to the cold-field emission source and the mirror electrode comprises configuring the switch to electrically connect the mirror electrode to the cold-field emission source; and
positively biasing the mirror electrode and the anode with respect to the extractor electrode comprises configuring the switch to electrically connect the mirror electrode to the anode.

15. The method of claim 14, wherein:
positively biasing the extractor electrode with respect to the cold-field emission source and the mirror electrode further comprises applying a first negative voltage to the cold-field emission source and the mirror electrode and applying a second negative voltage to the extractor electrode, wherein the magnitude of the second negative voltage is less than the magnitude of the first negative voltage;
positively biasing the extractor electrode with respect to the cold-field emission source comprises applying the first negative voltage to the cold-field emission source and applying the second negative voltage to the extractor electrode; and
positively biasing the mirror electrode and the anode with respect to the extractor electrode further comprises grounding the mirror electrode and the anode.

16. The method of claim 9, further comprising baking out the extractor electrode and flashing the cold-field emission source before cleaning the extractor electrode.

17. The method of claim 9, wherein:
the first opening is situated beneath the cold-field emission source; and
the second opening is situated beneath the first opening.

18. The method of claim 17, wherein the second opening is wider than the first opening.

19. The method of claim 17, wherein the extractor electrode and the mirror electrode are radially symmetric about an axis through the cold-field emission source, the first opening, and the second opening.

* * * * *